(12) United States Patent
Akahori et al.

(10) Patent No.: US 7,821,056 B2
(45) Date of Patent: Oct. 26, 2010

(54) NONVOLATILE SEMICONDUCTOR MEMORY DEVICE AND METHOD OF MANUFACTURING THE SAME

(75) Inventors: Hiroshi Akahori, Yokohama (JP); Wakako Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 11/902,290

(22) Filed: Sep. 20, 2007

(65) Prior Publication Data

US 2008/0073701 A1      Mar. 27, 2008

(30) Foreign Application Priority Data

Sep. 21, 2006      (JP)      ............... 2006-256009

(51) Int. Cl.
    *H01L 29/76*      (2006.01)
(52) U.S. Cl. ............... 257/321; 438/257; 438/775
(58) Field of Classification Search .......... 257/E21.662, 257/E21.679
    See application file for complete search history.

(56) References Cited

U.S. PATENT DOCUMENTS

| 6,107,169 | A * | 8/2000 | Park ............... 438/532 |
| 6,153,470 | A * | 11/2000 | He et al. ............... 438/257 |
| 7,622,383 | B2 * | 11/2009 | Kim et al. ............... 438/657 |
| 2006/0234454 | A1 * | 10/2006 | Yasui et al. ............... 438/267 |
| 2007/0020841 | A1 * | 1/2007 | Hwang et al. ............... 438/216 |
| 2008/0032465 | A1 * | 2/2008 | Ahn et al. ............... 438/142 |
| 2009/0134465 | A1 * | 5/2009 | Shimizu ............... 257/368 |

FOREIGN PATENT DOCUMENTS

| JP | 8-83854 | 3/1996 |
| JP | 2001-15504 | 1/2001 |
| JP | 2001-127178 | 5/2001 |
| JP | 2002-261091 | 9/2002 |
| JP | 2002-289713 | 10/2002 |
| JP | 2003-17595 | 1/2003 |
| JP | 2003-309117 | 10/2003 |
| JP | 2004-200672 | 7/2004 |
| JP | 2005-93562 | 4/2005 |
| JP | 2005-150738 | 6/2005 |

OTHER PUBLICATIONS

H. Akahori et al., "Atomic Order Flattening of Hydrogen-Terminated Si(110) substrate For Next Generation ULSI Devices," Extended Abstracts of the 2003 International Conference on Solid State Devices and Materials (2003), pp. 458-459.

(Continued)

*Primary Examiner*—Thao Le
(74) *Attorney, Agent, or Firm*—Finnegan, Henderson, Farabow, Garrett & Dunner, L.L.P.

(57) ABSTRACT

A nonvolatile semiconductor memory device includes an array of nonvolatile memory cell transistors, each of which is configured such that a tunnel insulation film, a floating gate electrode, a floating gate insulation film and a control gate electrode are stacked on a surface of a semiconductor substrate. A mean roughness of an interface between a polysilicon, of which the floating gate electrode is formed, and the floating gate insulation film is 1.5 nm or less.

16 Claims, 6 Drawing Sheets

OTHER PUBLICATIONS

A Notification of Reasons For Rejection mailed by the Japanese Patent Office on Feb. 17, 2009, for Japanese Patent Application No. 2006-256009, and English language translation thereof.
Ho et al., "Thermal Oxidation of Heavily Phosphorus-Doped Silicon," Purification of Metallurgical Silicon (Apr. 1978), 125:665-671.

Decision of Rejection, mailed May 25, 2010, in corresponding Japanese Patent Application No. 2006-256009, and English-language translation thereof.

* cited by examiner

NONVOLATILE SEMICONDUCTOR MEMORY DEVICE AND METHOD OF
MANUFACTURING THE SAME

CROSS-REFERENCE TO RELATED APPLICATIONS

This application is based upon and claims the benefit of priority from prior Japanese Patent Application No. 2006-256009, filed Sep. 21, 2006, the entire contents of which are incorporated herein by reference.

BACKGROUND OF THE INVENTION

1. Field of the Invention

The present invention relates to a nonvolatile semiconductor memory device in which data write/erase is electrically executed, and a method of manufacturing the nonvolatile semiconductor memory device, and the invention relates, for example, to a structure of an interface between a polysilicon for a floating gate of a nonvolatile memory cell and a floating gate insulation film.

2. Description of the Related Art

As is known, concentration of electric field occurs in a polysilicon, which forms a floating gate electrode of a nonvolatile semiconductor memory device, due to irregularities on the surface of the polysilicon. Consequently, degradation occurs in resistance to electrical dielectric breakdown or in reliability of an inter-gate insulation film (hereinafter referred to as "floating gate insulation film") which is formed on the polysilicon. To overcome this problem, Jpn. Pat. Appln. KOKAI Publication No. 2003-017595 discloses that a polysilicon with corner portions is assumed as a floating gate electrode, and the radius of curvature of each corner portion is set at 3 nm or more, thereby obtaining a highly reliable floating gate insulation film.

However, if the capacitor area of a memory cell decreases due to scaling and the amount of leak current from the floating gate insulation film increases up to a level that is comparable with the amount of tunnel current, the reliability is affected not only by irregularities but also by micro-roughness on the surface of the polysilicon.

Microscopically observable fine irregularities appear at the interface between the polysilicon of the floating gate electrode and the floating gate insulation film. Conventionally, an ONO structure, which is a stacked structure of silicon oxide films and a silicon nitride film is used as the floating gate insulation film. In recent years, there have been attempts to form the floating gate insulation film of a metal oxide.

In the prior art, in many cases, when the floating gate insulation film is formed, a silicon oxide is formed on the surface of the floating gate polysilicon by using oxygen as an oxidizer. The formation of the silicon oxide on the surface of the floating gate polysilicon is advantageous in that the resistance to leak is high because the silicon oxide has a large barrier height, and that a high-quality insulation film can also be formed on the surface of the polysilicon.

However, if oxygen molecules or water is used in order to oxidize the surface of the polysilicon, the surface is roughened. FIG. 7 shows the plane direction dependency of the relationship between the oxidation time and the thickness of the silicon oxide film ($SiO_2$) in dry oxidation. FIG. 8 shows the plane direction dependency of the oxidation rate in wet oxidation.

It is understood that in both cases of FIG. 7 and FIG. 8 the oxidation rate in a (100) plane is lower than that in a (111) plane or (110) plane. If the polysilicon surface is oxidized by an anisotropic oxidation process in which the oxidation rate differs depending on the plane direction, micro-roughness occurs as shown in FIG. 9.

FIG. 9A to FIG. 9C illustrate a roughness increase model on a polysilicon surface due to anisotropic oxidation. FIG. 9A shows a pre-oxidation state, FIG. 9B shows a post-oxidation state, and FIG. 9C shows, in enlarged scale, a part of the surface after oxidation. In FIG. 9C, various plane directions are exposed at a grain boundary portion surrounded by a broken line.

Besides, the dry oxidation and wet oxidation have such characteristics that the oxidation rate varies depending on the concentration of phosphorus that is a dopant in the polysilicon. FIG. 10 shows the phosphorus concentration dependency of an oxidation rate constant (B/A constant, B constant) in dry $O_2$ oxidation. The B/A constant and B constant are constants that are used in an oxidation model proposed by Deal-Grove. The B/A constant indicates surface reactivity, and the B constant indicates a diffusion behavior of an oxidation seed in an oxide film (see Jpn. Pat. Appln. KOKAI Publication No. 2003-017595, and C. P. Ho et al., "J. Electrochem. Soc.", 125, 665 (1978)).

As is understood from FIG. 10, when the phosphorus concentration in silicon is high, the B/A constant increases (i.e. surface reactivity increases). This means that when the phosphorus concentration is high at an initial stage of oxidation, enhanced oxidation occurs. In usual cases, phosphorus in an amount of 1E20 atoms/$cm^3$ or more is doped in a floating gate polysilicon. Although phosphorus is present within the silicon crystal grains, high-concentration phosphorus is precipitated, in usual cases, at crystal grain boundaries. If an oxidation process is carried out in this state, the oxidation rate at the crystal grain boundary, at which high-concentration phosphorus is precipitated, increases and, as a result, the roughness of the floating gate polysilicon surface increases (see FIG. 11). FIG. 11 shows a roughness increase model at a crystal grain boundary on the polysilicon surface which is doped with phosphorus (P). In FIG. 11, enhanced oxidation due to P occurs in a region surrounded by a broken line, and high-concentration P is precipitated.

From the above discussion, it can be said that if conventional dry $O_2$ oxidation or wet treatment is performed at the time of forming a silicon oxide film that is one of structural elements of a floating gate insulation film, the roughness of the floating gate polysilicon surface increases.

Micro-roughness in an insulated-gate field-effect transistor (FET) is mentioned in Jpn. Pat. Appln. KOKAI Publication No. 2004-200672. In addition, Jpn. Pat. Appln. KOKAI Publication No. 2005-150738 discloses that the mean roughness of the floating gate surface is 3 nm or less, as a mere example of a numerical value in a fabrication process of a floating gate insulation film of a nonvolatile memory transistor.

BRIEF SUMMARY OF THE INVENTION

According to an aspect of the present invention, there is provided a nonvolatile semiconductor memory device comprising an array of nonvolatile memory cell transistors, each of the nonvolatile memory cell transistors including a tunnel insulation film formed on a surface of a semiconductor substrate, a floating gate electrode formed on the tunnel insulation film, a floating gate insulation film formed on the floating gate electrode, and a control gate electrode formed on the floating gate insulation film, wherein a mean roughness of an interface between a polysilicon, of which the floating gate electrode is formed, and the floating gate insulation film is 1.5 nm or less.

According to another aspect of the present invention, there is provided a method of manufacturing a nonvolatile semiconductor memory device including an array of nonvolatile memory cell transistors, each of which is configured such that a tunnel insulation film, a floating gate electrode, a floating gate insulation film and a control gate electrode are stacked on a surface of a semiconductor substrate, the method comprising: subjecting a surface of a polysilicon, of which the floating gate electrode is formed, to a nitriding process at a time of manufacturing the nonvolatile semiconductor memory device, thereby setting a mean roughness of an interface between the polysilicon and the floating gate insulation film at 1.5 nm or less.

BRIEF DESCRIPTION OF THE SEVERAL VIEWS OF THE DRAWING

FIG. 6 shows the relationship between a leak current of a floating gate insulation film and a radius of curvature of a floating gate electrode surface;

DETAILED DESCRIPTION OF THE INVENTION

Figure 1A:
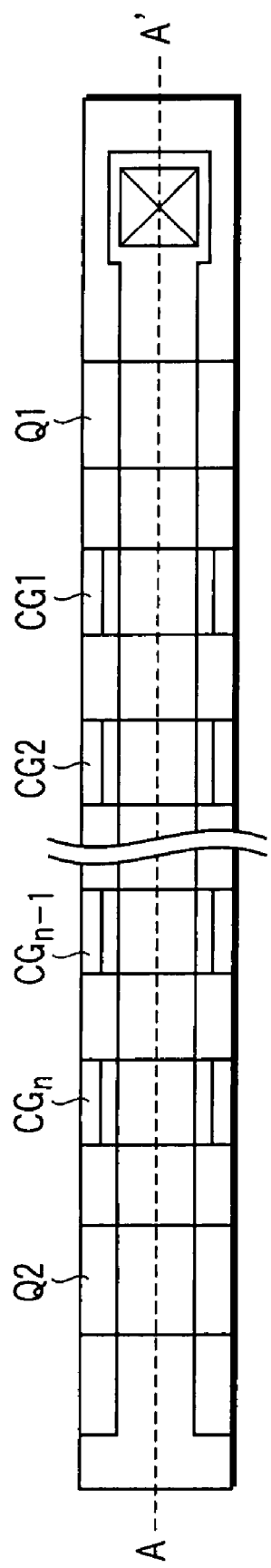
FIG. 1A is a plan view that schematically shows an example of a NAND cell in a cell array of a NAND flash memory relating to an embodiment of a nonvolatile semiconductor memory device according to the present invention.

An embodiment of the present invention will now be described with reference to the accompanying drawings. In the description below, common parts are denoted by like reference numerals throughout the specification.

Figure 1B:
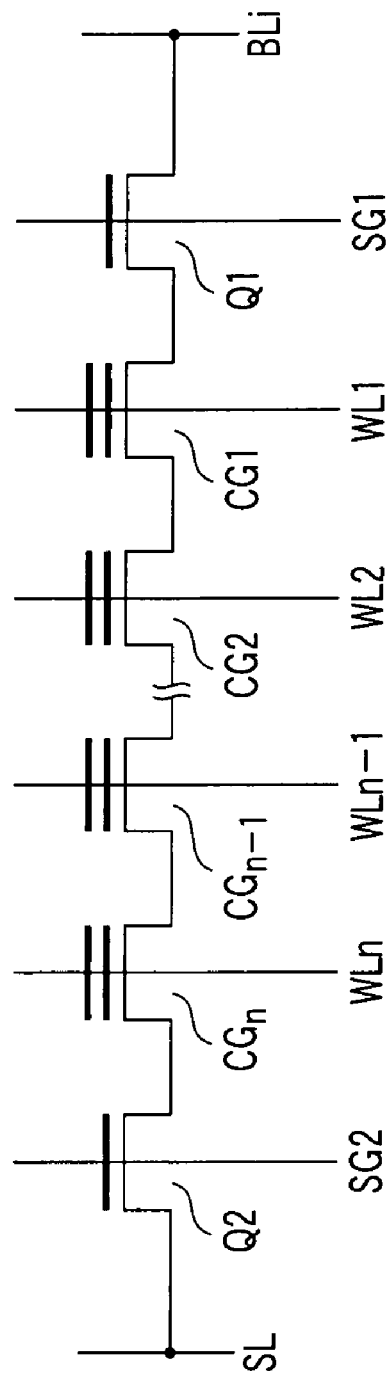
FIG. 1B is an equivalent circuit diagram that schematically shows an example of the NAND cell in FIG. 1A.
Figure 2:
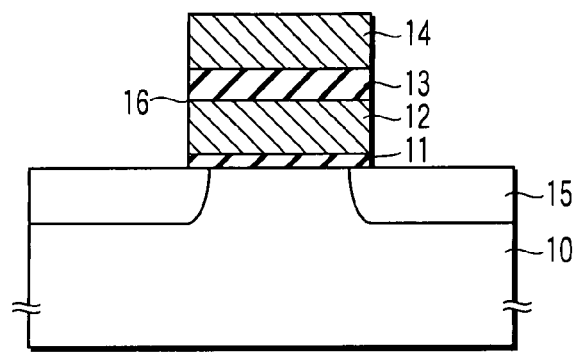
FIG. 2 is a cross-sectional view that schematically shows one of cell transistors in the NAND cell in FIG. 1A.

FIG. 1A and FIG. 1B are a plan view and an equivalent circuit diagram which schematically show an example of a NAND cell in a cell array of a NAND flash memory relating to an embodiment of a nonvolatile semiconductor memory device according to the present invention. FIG. 2 is a cross-sectional view that schematically shows one of cell transistors in the NAND cell in FIG. 1A. As is shown in FIG. 1A and FIG. 1B, a plurality of cell transistors CG1 to CGn, each of which is formed of an n-channel MOSFET having a floating gate and a control gate, are connected in series. The drain of the cell transistor CG1, which is positioned at one end of the series-connected cell transistors CG1 to CGn, is connected to a bit line BLi (i=1, 2 . . . ) via an NMOS transistor Q1 for selection, and the source of the cell transistor CGn, which is positioned at the other end of the series-connected cell transistors CG1 to CGn, is connected to a source line SL via an NMOS transistor Q2 for selection.

The respective transistors are formed on the same well substrate. Control electrodes of the cell transistors CG1 to CGn are connected to word lines WLi (i=1, 2, . . . , n) which are successively arranged in the row direction. The control electrode of the selection transistor Q1 is connected to a selection line SG1, and the control electrode of the selection transistor Q2 is connected to a selection line SG2. One end of each word line WLi (i=1, 2, . . . , n) has, via a metal wire, a connection pad for connection with a peripheral circuit, and is formed on a device isolation film.

As is shown in FIG. 2, each of the cell transistors CG1 to CGn is configured such that a tunnel insulation film 11, a polysilicon for a floating gate electrode 12, a floating gate insulation film 13 and a control gate electrode 14 are stacked on the surface of a semiconductor substrate 10, and source/drain regions 15 are formed on both sides of a channel region under the tunnel insulation film 11. In this cell transistor, a mean roughness (micro-roughness) Ra of an interface 16 between the floating gate electrode 12 and the floating gate insulation film 13 is 1.5 nm or less. By performing planarization to set the mean roughness Ra at 1.5 nm or less, the electrical reliability of the floating gate insulation film 13 can remarkably be enhanced, as will be described later.

Next, paying attention to a cross section taken along line A-A' in FIG. 1A, the outline of the fabrication process of the cell array of the NAND cell type flash memory is described with reference to FIG. 3A to FIG. 3F.

Figure 3A:
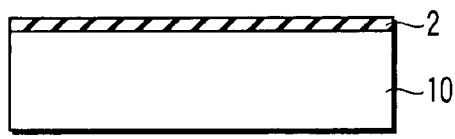
FIG. 3A is a cross-sectional view illustrating a fabrication step of the cell transistor shown in FIG. 1A.

To start with, as shown in FIG. 3A, a silicon oxide film 2 is formed on a semiconductor substrate 10 (e.g. silicon substrate) by using a thermal oxidation process.

Figure 3B:
FIG. 3B is a cross-sectional view illustrating a fabrication step of the cell transistor shown in FIG. 1A.

As shown in FIG. 3B, the silicon oxide film 2 is nitrided by using $NH_3$ gas, and then oxidized. Thus, a tunnel insulation film 11, which is composed of a silicon oxynitride film, is formed.

Figure 3C:
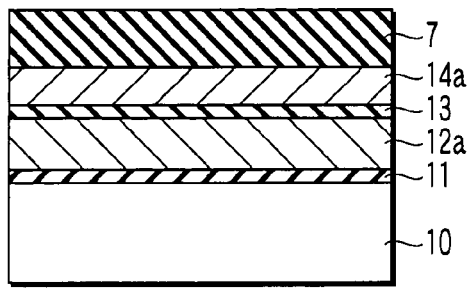
FIG. 3C is a cross-sectional view illustrating a fabrication step of the cell transistor shown in FIG. 1A.

Subsequently, as shown in FIG. 3C, a polysilicon film 12a for a floating gate electrode, in which phosphorus is doped as impurities, is formed on the tunnel insulation film 11 by CVD (Chemical Vapor Deposition). A floating gate insulation film 13 is formed on the polysilicon film 12a, and a polysilicon film 14a for a control gate electrode, in which phosphorus is doped as impurities, is formed on the floating gate insulation film 13 by LP (Low Pressure) CVD. Further, a silicon nitride film 7 is formed on the control gate polysilicon 14a by using LPCVD.

Figure 3D:
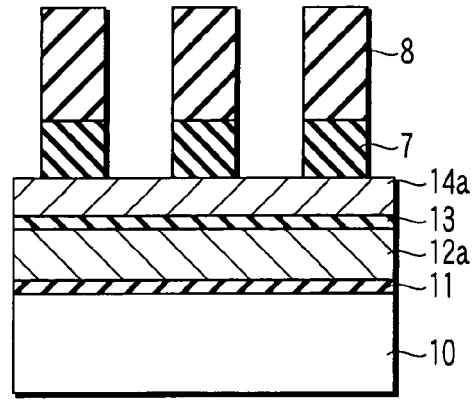
FIG. 3D is a cross-sectional view illustrating a fabrication step of the cell transistor shown in FIG. 1A.

As shown in FIG. 3D, a photoresist 8 is coated on the silicon nitride film 7, and the silicon nitride film 7 is processed to have a desired pattern by using a lithography method. Then, the photoresist 8 is removed.

Figure 3E:
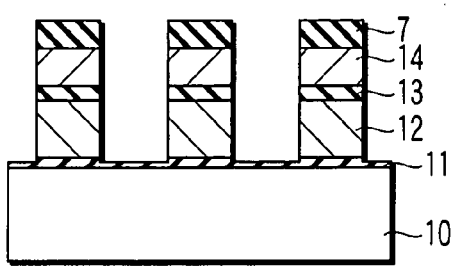
FIG. 3E is a cross-sectional view illustrating a fabrication step of the cell transistor shown in FIG. 1A.

Subsequently, as shown in FIG. 3E, using the silicon nitride film 7 as a mask, the polysilicon film 14a for the control gate electrode, the floating gate insulation film 13 and the polysilicon 12a for the floating gate electrode are successively etched in the vertical direction. Thus, the floating gate electrode 12, floating gate insulation film 13 and control gate electrode 14 are patterned.

Figure 3F:
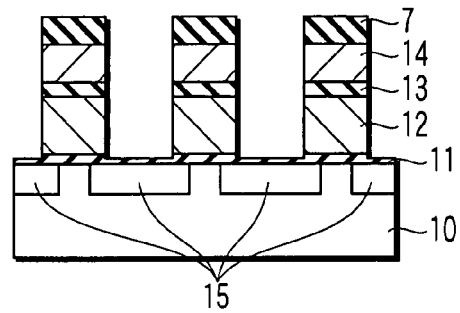
FIG. 3F is a cross-sectional view illustrating a fabrication step of the cell transistor shown in FIG. 1A.

Further, as shown in FIG. 3F, in order to form source/drain regions 15 of the cell transistor, P ions are doped in the silicon substrate 10 and activated by thermal anneal.

In the meantime, in the step shown in FIG. 3C, after the polysilicon film 12a for the floating gate electrode is formed, the surface of the polysilicon film 12a is planarized prior to the formation of the floating gate insulation film 13. Thereby, the reliability of the floating gate insulation film 13 is improved. A description is now given of the result of examination of the relationship between the roughness of the polysilicon surface of a floating gate and the electrical reliability of a floating gate insulation film, the examination being conducted using a planar-structure capacitor having upper and lower electrodes which are formed of polysilicon.

To begin with, the surface of the polysilicon is planarized. Specifically, a radical oxidation process is performed on the polysilicon surface, and a resultant oxide film is peeled. By repeating these steps several times, the polysilicon surface is planarized. In the radical oxidation process, a mixture solution of HF and HCl was used as a liquid for peeling the oxide film, thereby to prevent anisotropic etching on the polysilicon surface due to OH ions in the solution. It is reported in a document (H. Akahori et al., "Extend Abstracts of the 2003 International Conference on Solid State Devices and Materials", p. 458) that the radical oxidation process is very effective for the planarization of the silicon surface since the plane direction dependency of the oxidation rate is very low.

After the polysilicon surface is planarized by the radical oxidation process, surface oxidation is performed by dry $O_2$ oxidation. Thereafter, by performing a DHF (diluted hydrofluoric acid) process, the oxide film on the surface was peeled. In the dry $O_2$ oxidation, the plane direction dependency of the oxidation rate is high, and phosphorus enhanced oxidation takes place at a grain boundary interface of polysilicon, and as a result the surface is roughened by the oxidation. By varying the thickness of the oxide film, the roughness of the surface of the floating gate insulation film 13 was varied.

Figure 4:
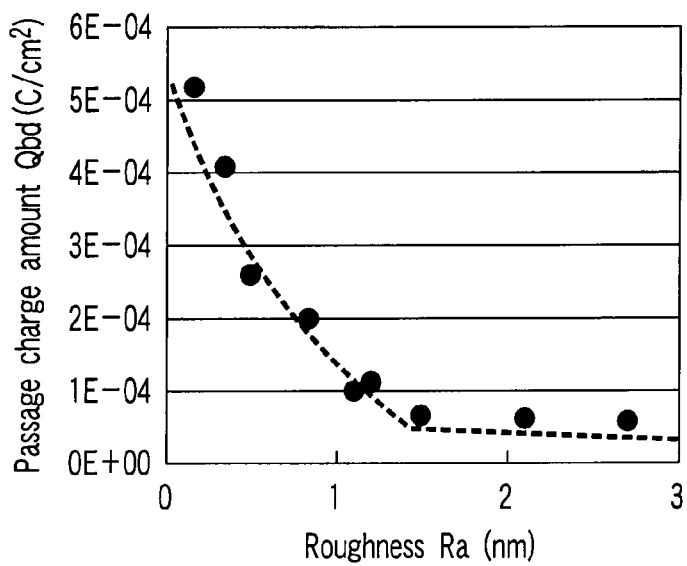
FIG. 4 is a characteristic graph showing the relationship between roughness of a floating gate polysilicon surface in FIG. 1A and a passage charge amount until reaching breakdown in time-dependent dielectric breakdown evaluation of a floating gate insulation film.
Figure 5:
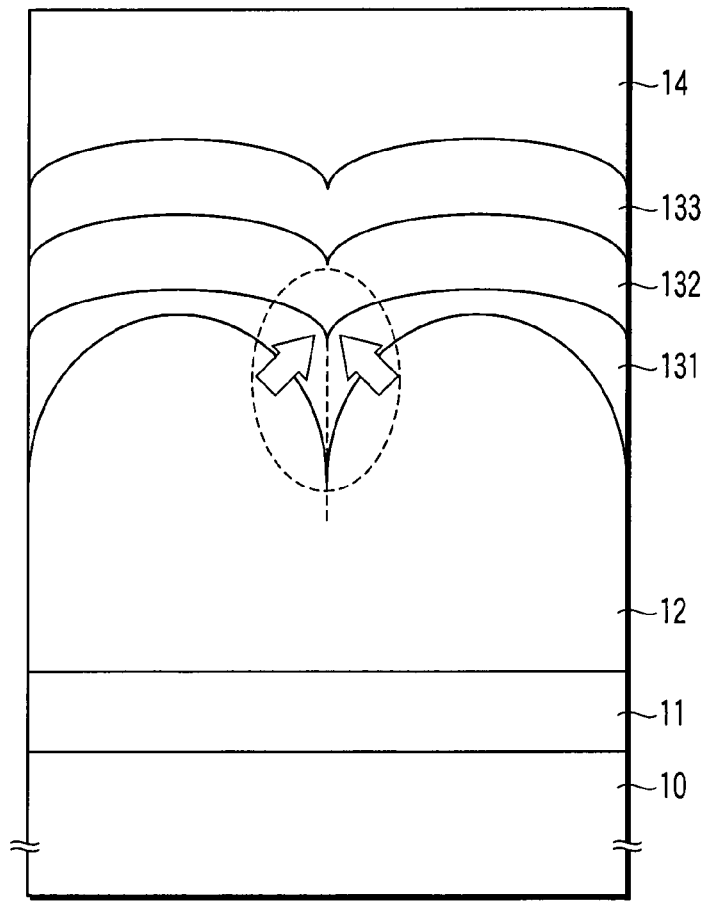
FIG. 5 is a view showing a model of quality enhancement of an insulation film by reduction in roughness.
Figure 7:
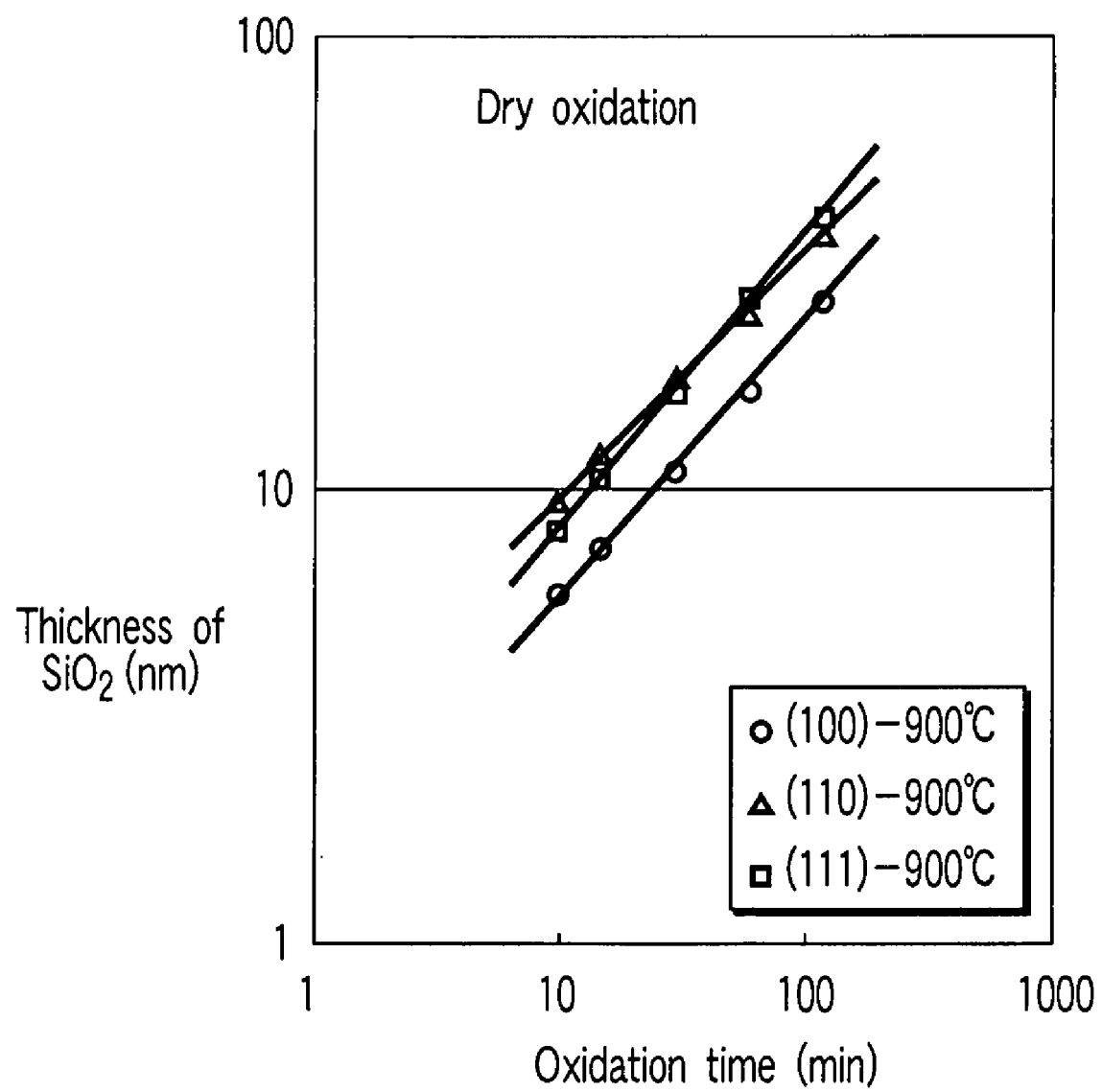
FIG. 7 is a characteristic graph showing the plane direction dependency of a dry oxidation rate.
Figure 8:
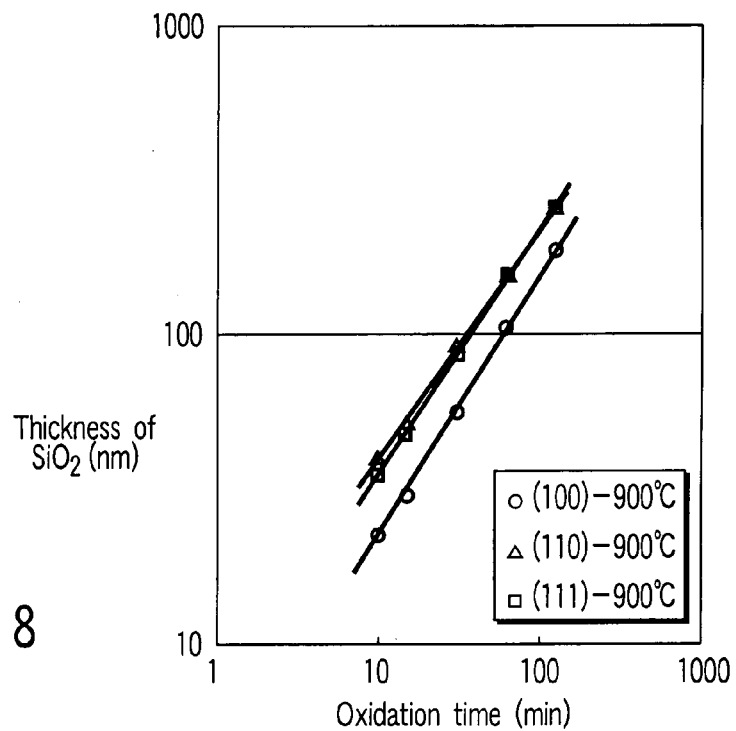
FIG. 8 is a characteristic graph showing the plane direction dependency of a wet oxidation rate.
Figure 9A:
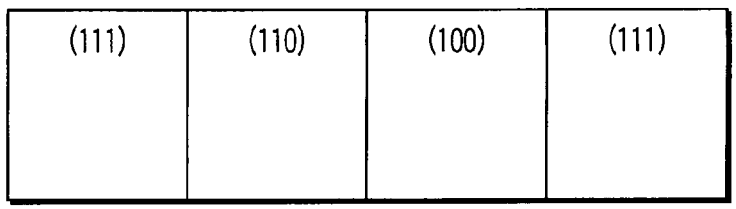
FIG. 9A shows a roughness increase model of a polysilicon surface by anisotropic oxidation.
Figure 9B:
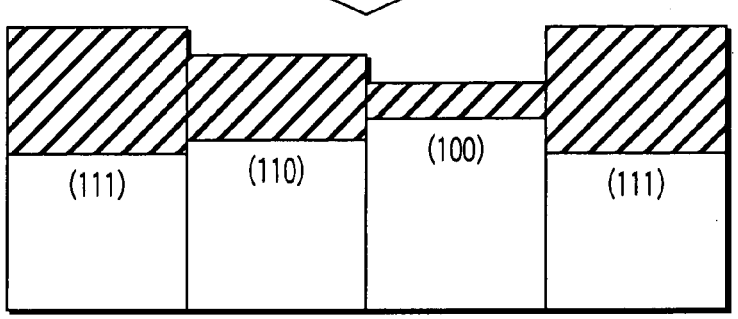
FIG. 9B shows the roughness increase model of the polysilicon surface by anisotropic oxidation.
Figure 9C:
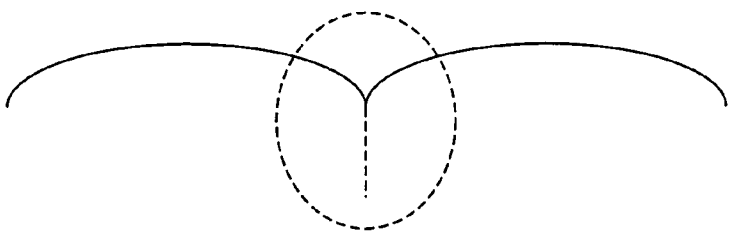
FIG. 9C shows the roughness increase model of the polysilicon surface by anisotropic oxidation.
Figure 10:
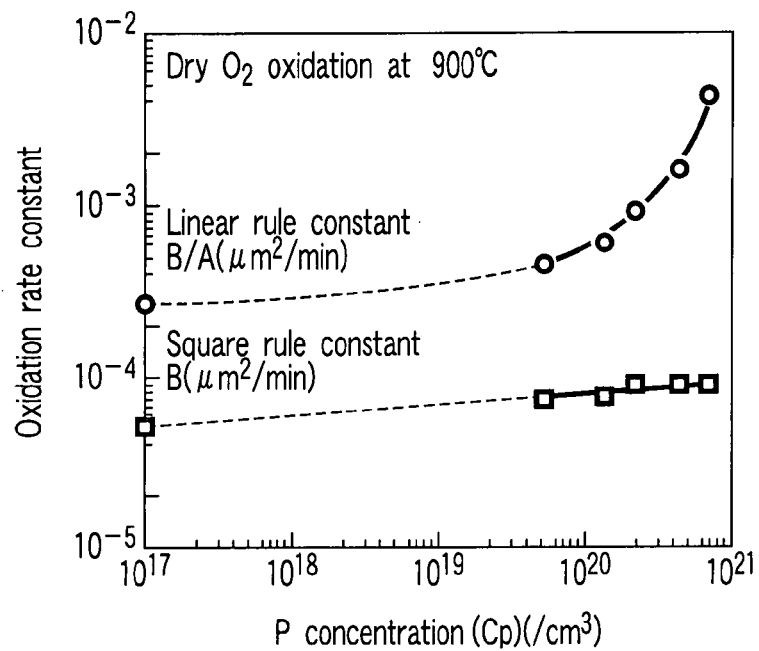
FIG. 10 is a characteristic graph showing the phosphorus concentration dependency of a B/A constant and a B constant in dry oxidation.
Figure 11:
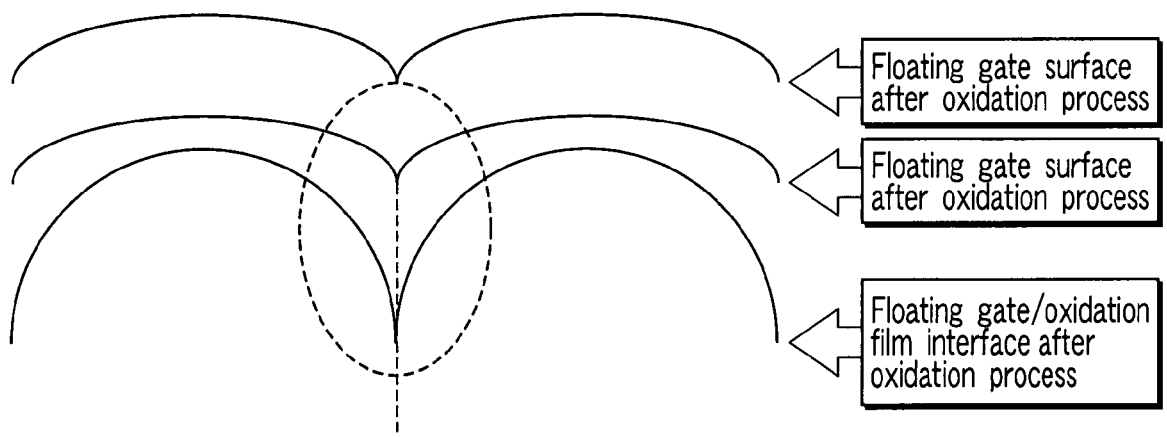
FIG. 11 shows a roughness increase model at a crystal grain boundary of a phosphorus-doped polysilicon surface.

FIG. 4 is a characteristic graph showing the relationship between roughness Ra of the surface of the polysilicon for the floating gate electrode and a passage charge amount Qbd which leads to breakdown in the time-dependent dielectric breakdown (TDDB) evaluation of a floating gate insulation film. For example, as shown in FIG. 5, an ONO structure comprising a silicon oxide film 131 (5 nm), a silicon nitride film 132 (8 nm) and a silicon oxide film 133 (5 nm) was adopted in the floating gate insulation film.

According to FIG. 4, the Qbd value increases as the roughness Ra decreases. In particular, it is understood that the Qbd sharply increases when the Ra is about 1.5 nm. FIG. 5 shows a model of quality enhancement of an insulation film by reduction in roughness of the floating gate electrode polysilicon surface. As shown in FIG. 5, one factor for the above may be that in the case where the roughness Ra is large, a microscopical stress (indicated by arrows) acts on an interface insulation film, but the stress decreases as the Ra decreases. Although Jpn. Pat. Appln. KOKAI Publication No. 2003-017595 discloses that the radius of curvature of irregularities on the micro-roughness part is 3 nm or more, the radius of curvature may be 3 nm or less. By the way, the roughness Ra was measured by AMF (Atomic Force Microscopy) method.

FIG. 6 shows the relationship between a leak current (when an application voltage on an insulation film is 12 V) of an floating gate insulation film with a thickness of 14 nm in terms of an oxide film, and a radius R of curvature of a floating gate electrode surface. In accordance with a decrease in radius of curvature, concentration of electric field occurs at a projection portion and a leak current increases. However, if the radius of curvature decreases to 3 nm or less, the leak current decreases conversely. One factor may be that if the radius of curvature decreases, the density of minute projection portions increases so that local concentration of electric field hardly occurs, and, as a result, leak current flows over the entirety of the capacitor. By reducing the interface roughness, the electrical reliability of the floating gate insulation film is remarkably improved.

In this embodiment, too, in order to obtain the floating gate polysilicon surface, the surface of the polysilicon 12a was subjected to the radial oxidation process, and the step of peeling the oxide film was performed, and thus the surface was planarized. An HF (hydrofluoric acid)-based solution with low pH was used to peel the radical oxide film, thereby to prevent etching of the polysilicon surface.

Next, the fabrication process advances to the step of forming the floating gate insulation film 13. In this step, it is required to uniformly form the floating gate insulation film 13 without roughening the surface of the polysilicon film 12a, which has been planarized as described above. Various methods of forming the floating gate insulation film 13 will now be described.

(First Method)

An ONO film structure is formed as the floating gate insulation film 13. To begin with, the polysilicon surface, which is planarized as described above, is subjected to DHF treatment, and a native oxide film on the surface is removed, and then the radical oxidation process is carried out. The radical oxidation process, as described above, has the advantageous effect of planarizing the surface without roughening the surface. Thereafter, a silicon nitride film is formed by CVD, and the silicon nitride film is subjected to the oxidation process. Thus, a silicon oxide film is formed.

(Second Method)

An ONO film structure is formed as the floating gate insulation film 13. To begin with, the polysilicon surface, which is planarized as described above, is subjected to DHF treatment, and then to ozone water treatment. By the ozone water treatment, the surface is covered with a uniform chemical silicon oxide film. It is understood that neither plane direction dependency nor phosphorus enhanced oxidation occurs in the chemical silicon oxide film which is formed by the ozone water treatment, and the uniformity of the chemical silicon oxide film is very high. Thereafter, the radical nitriding process is performed. As regards the radical nitriding process, it has been examined that neither plane direction dependency nor phosphorus enhanced nitriding takes place, and the uniformity is very high. A nitriding seed for the radical nitriding may be an N radical, an NH radical or an N ion, or may be a nitriding seed including at least one of them. Thereafter, a stacked film of a silicon oxide film and a silicon nitride film are formed by CVD. The silicon nitride film of the stacked film is subjected to oxidation, and thereby a silicon oxide film is formed.

(Third Method)

The polysilicon film surface, which is planarized as described above, is subjected to DHF treatment, and then to ozone water treatment. Thereafter, the radical nitriding process is performed. Further, a single film or a stacked film, which includes at least one of a silicon oxide film, a silicon nitride film, a metal oxide thin film, a metal nitride thin film and a metal oxynitride thin film, is formed. The metal oxide and the metal nitride may be an oxide including at least one of Al, Hf, Zr, La and Si (e.g. hafnium oxide), or may be a nitride or an oxynitride including at least one of Al, Hf, Zr, La and Si.

As described above, the nitriding seed in the nitriding process includes at least one of the N radical, NH radial and N ion. Thereby, the surface of the polysilicon film 12 for the floating gate is not roughened, and an interface in a good matching state can be formed.

As has been described above, the inventor has found, as a result of the diligent study, that microscopic irregularities on the surface of the polysilicon, which forms the floating gate electrode, affects the reliability of the floating gate insulation film, and also has found, as a result of the examination of the relationship between the roughness of the polysilicon surface and the reliability, that the reliability can remarkably be improved by reducing the irregularities on the surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising an array of nonvolatile memory cell transistors, each of the nonvolatile memory cell transistors including:
   a tunnel insulation film formed on a surface of a semiconductor substrate;
   a floating gate electrode formed on the tunnel insulation film;
   a floating gate insulation film formed on the floating gate electrode; and
   a control gate electrode formed on the floating gate insulation film,
   wherein a mean roughness of an interface between a polysilicon, of which the floating gate electrode is formed, and the floating gate insulation film is 1.5 nm or less.

2. The device according to claim 1, wherein a radius of curvature of irregularities on a surface of the polysilicon, of which the floating gate electrode is formed, is 3 nm or less.

3. The device according to claim 1, wherein the floating gate insulation film has an ONO structure comprising three layers which are a silicon oxide film, a silicon nitride film and a silicon oxide film.

4. The device according to claim 3, wherein the silicon oxide film has a thickness of 5 nm or less, and the silicon nitride film has a thickness of 8 nm or less.

5. The device according to claim 1, wherein the floating gate insulation film has an NONO structure comprising four layers which are a silicon nitride film, a silicon oxide film, a silicon nitride film and a silicon oxide film.

6. The device according to claim 1, wherein the floating gate insulation film is configured to include a nitride film, and to include a single film or a stacked film, which is provided on the nitride film and includes at least one of a silicon oxide film, a silicon nitride film, a metal oxide thin film, a metal nitride thin film and a metal oxynitride thin film.

7. The device according to claim 6, wherein the metal oxide is an oxide including at least one of Al, Hf, Zr, La and Si, and the metal nitride is a nitride or an oxynitride including at least one of Al, Hf, Zr, La and Si.

8. The device according to claim 1, wherein the array comprises:
   a plurality of said nonvolatile memory cell transistors having a series-connected current path;
   a bit line which is connected via a first selection transistor provided at one end of the current path; and
   a source line which is connected via a second selection transistor provided at the other end of the current path.

9. The device according to claim 8, wherein the array further comprises:
   a plurality of word lines which are connected, respectively, to control gate electrodes of the plurality of nonvolatile memory cell transistors, one end of each of the plurality of word lines having, via a metal wire, a connection pad for connection to a peripheral circuit, and being formed on a device isolation film;
   a first selection line connected to a control electrode of the first selection transistor; and
   a second selection line connected to a control electrode of the second selection transistor.

10. A method of manufacturing a nonvolatile semiconductor memory device including an array of nonvolatile memory cell transistors, each of which is configured such that a tunnel insulation film, a floating gate electrode, a floating gate insulation film and a control gate electrode are stacked on a surface of a semiconductor substrate, the method comprising:
    subjecting a surface of a polysilicon, of which the floating gate electrode is formed, to a nitriding process at a time of manufacturing the nonvolatile semiconductor memory device, thereby setting a mean roughness of an interface between the polysilicon and the floating gate insulation film at 1.5 nm or less.

11. The method of manufacturing the device, according to claim 10, wherein a seed for nitriding in the nitriding process includes at least one of an N radical, an NH radial and an N ion.

12. The method of manufacturing the device, according to claim 10, further comprising:
    subjecting the surface of the polysilicon to a wet etching process using an HF-based liquid, prior to the nitriding process; and
    forming a chemical oxide film by treatment using ozone water.

13. The method of manufacturing the device, according to claim 10, wherein after the nitriding process, an oxide or a nitride including at least one of Al, Hf, Zr, La and Si is formed as the floating gate insulation film.

14. The method of manufacturing the device, according to claim 10, further comprising:
    forming, after the nitriding process, a single film or a stacked film, which includes at least one of a silicon oxide film, a silicon nitride film, a metal oxide thin film, a metal nitride thin film and a metal oxynitride thin film.

15. The method of manufacturing the device, according to claim 14, wherein each of the metal oxide thin film, the metal nitride thin film and the metal oxynitride thin film is a film including at least one of Al, Hf, Zr, La and Si.

16. The device according to claim 1, wherein the floating gate insulation film is formed on a (100) plane, a (110) plane, or a (111) plane of the floating gate electrode.

* * * * *

UNITED STATES PATENT AND TRADEMARK OFFICE
CERTIFICATE OF CORRECTION

| | |
|---|---|
| PATENT NO. | : 7,821,056 B2 |
| APPLICATION NO. | : 11/902290 |
| DATED | : October 26, 2010 |
| INVENTOR(S) | : Akahori et al. |

It is certified that error appears in the above-identified patent and that said Letters Patent is hereby corrected as shown below:

Claim 11, column 8, line 39, change "NH radial" to --NH radical--.

Signed and Sealed this
Eleventh Day of January, 2011

David J. Kappos
*Director of the United States Patent and Trademark Office*